United States Patent
Arvin et al.

(10) Patent No.: US 11,164,804 B2
(45) Date of Patent: Nov. 2, 2021

(54) INTEGRATED CIRCUIT (IC) DEVICE PACKAGE LID ATTACH UTILIZING NANO PARTICLE METALLIC PASTE

(71) Applicant: International Business Machines Corporation, Armonk, NY (US)

(72) Inventors: Charles L. Arvin, Poughkeepsie, NY (US); Kevin Drummond, Wappingers Falls, NY (US); Luca Del Carro, Adliswil (CH); Thomas Brunschwiler, Thalwil (CH); Stephanie Allard, St-Hyacinthe (CA); Kenneth C. Marston, Poughquag, NY (US); Marcus E. Interrante, Ulster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/519,277

(22) Filed: Jul. 23, 2019

(65) Prior Publication Data
US 2021/0028079 A1    Jan. 28, 2021

(51) Int. Cl.
| | |
|---|---|
| *H01L 23/10* | (2006.01) |
| *H01L 23/31* | (2006.01) |
| *H01L 21/56* | (2006.01) |
| *H01L 23/053* | (2006.01) |
| *H01L 23/057* | (2006.01) |
| *H01L 23/367* | (2006.01) |

(Continued)

(52) U.S. Cl.
CPC ............ *H01L 23/10* (2013.01); *H01L 21/563* (2013.01); *H01L 23/053* (2013.01); *H01L 23/057* (2013.01); *H01L 23/3142* (2013.01); *H01L 23/3171* (2013.01); *H01L 23/3675* (2013.01); *H01L 24/17* (2013.01); *H01L 25/0655* (2013.01)

(58) Field of Classification Search
CPC ... H01L 23/10; H01L 23/053; H01L 23/3142; H01L 23/315; H01L 23/3677; H01L 21/563
See application file for complete search history.

(56) References Cited

U.S. PATENT DOCUMENTS

| | | | |
|---|---|---|---|
| 5,528,462 | A | 6/1996 | Pendse |
| 5,847,929 | A | 12/1998 | Bernier et al. |

(Continued)

FOREIGN PATENT DOCUMENTS

WO    9950904 A1    10/1999

OTHER PUBLICATIONS

Ding, Fei, "Flip Chip and Lid Attachment Assembly Process Development," A Dissertation Submitted to the Graduate Faculty of Auburn University in Partial Fulfillment of the Requirements for the Degree of Doctor of Philosophy, Dec. 15, 2006.

*Primary Examiner* — Phat X Cao
(74) *Attorney, Agent, or Firm* — ZIP Group PLLC

(57) ABSTRACT

An IC device package includes a carrier, one or more IC devices and a lid. The lid includes a lid-ridge. The lid is connected to the carrier by connecting the lid-ridge to the carrier with first nano particle metallic paste, prior to connecting the IC device to the carrier. Subsequent to connecting the IC device to the carrier, the lid is connected to the lid-ridge with second nano particle metallic paste. The nano particle metallic paste may be sintered to form a metallic connection. In multi-IC device packages, the lid-ridge may be positioned between the lid and the carrier and between the IC devices.

6 Claims, 14 Drawing Sheets

(51) Int. Cl.
*H01L 25/065* (2006.01)
*H01L 23/00* (2006.01)

(56) References Cited

U.S. PATENT DOCUMENTS

| | | | |
|---|---|---|---|
| 6,396,136 B2 | 5/2002 | Kalidas et al. |
| 6,951,773 B2 | 10/2005 | Ho |
| 6,987,058 B2 | 1/2006 | Hall |
| 7,042,073 B2 | 5/2006 | Kado |
| 7,091,064 B2 | 8/2006 | Jiang |
| 7,224,062 B2 | 5/2007 | Hsu |
| 7,402,901 B2 | 7/2008 | Hatano et al. |
| 7,745,944 B2 | 6/2010 | Fee |
| 7,851,906 B2 | 12/2010 | Alcoe et al. |
| 7,977,163 B1 | 7/2011 | Huemoeller |
| 8,394,679 B2 | 3/2013 | Eaton et al. |
| 8,772,927 B2 | 7/2014 | Bezama et al. |
| 8,796,072 B2 | 8/2014 | Kelly et al. |
| 8,802,507 B2 | 8/2014 | Chiang et al. |
| 8,896,110 B2 | 11/2014 | Hu et al. |
| 8,921,990 B2 | 12/2014 | Park et al. |
| 9,096,784 B2 | 8/2015 | Kuczynski et al. |
| 9,391,041 B2 | 7/2016 | Lin |
| 9,472,533 B2 | 10/2016 | Pendse |
| 9,502,360 B2 | 11/2016 | Lin et al. |
| 9,822,001 B2 | 11/2017 | Gritti et al. |
| 9,871,015 B1 | 1/2018 | Huemoeller et al. |
| 9,899,238 B2 | 2/2018 | Karhade et al. |
| 9,966,300 B1 | 5/2018 | Kelly et al. |
| 10,014,263 B2 | 7/2018 | Shuto |
| 2004/0150097 A1 | 8/2004 | Gaynes et al. |
| 2008/0157341 A1* | 7/2008 | Yang ........................ H01L 24/82 257/700 |
| 2009/0151972 A1 | 6/2009 | Potter |
| 2012/0159118 A1 | 6/2012 | Wong et al. |
| 2015/0255418 A1 | 9/2015 | Gowda et al. |
| 2018/0290882 A1 | 10/2018 | Rhee |
| 2018/0323130 A1* | 11/2018 | Liu ........................ C08L 83/00 |
| 2020/0091034 A1* | 3/2020 | Shao ........................ H01L 24/32 |
| 2020/0312741 A1* | 10/2020 | Wan ........................ H01L 23/36 |

\* cited by examiner

INTEGRATED CIRCUIT (IC) DEVICE PACKAGE LID ATTACH UTILIZING NANO PARTICLE METALLIC PASTE

FIELD OF THE EMBODIMENTS

Embodiments of the present invention generally relate to integrated circuit (IC) device packages, and more particularly to an IC device package that includes a lid that is connected to one or more other IC device package components utilizing a nano particle metallic paste.

DESCRIPTION OF THE RELATED ART

Integrated Circuit (IC) device packages that include the IC device upon an organic IC device carrier typically require lids that are close to the IC device. Such requirement may both reduce the stress on a thermal interface material between the IC device and the lid and also reduce the lid facing surface area of the carrier.

There may be some applications where it is necessary to connect the lid to the IC device package in lower temperature environments, relative to traditional lid attachment environments, to avoid stresses on the IC device and/or other IC device package components.

SUMMARY

In an embodiment of the present invention, an integrated circuit (IC) device carrier package is presented. The package includes an IC device carrier, an IC device connected to the upper surface of the IC device carrier, a lid-ridge, and underfill. The IC device carrier includes a first pad and a second pad both upon an upper surface of the IC device carrier. The lid-ridge includes a lid-ridge bar and a first contact and a second contact both upon a carrier facing surface of the lid-ridge bar. The first contact is connected to the first pad by a first metalized connection. The second contact is connected to the second pad by a second metalized connection. The underfill is attached to a bottom surface of the IC device and to the upper surface of the IC device carrier and attached to the carrier facing surface of the lid-ridge bar and to the upper surface of the IC device carrier.

In another embodiment of the present invention, a method of fabricating an integrated circuit (IC) device carrier package is presented. The method includes connecting a lower contact of a lid-ridge to a pad of an IC device carrier with a first nano particle metallic paste, subsequently attaching an IC device to the IC device carrier, forming a contiguous underfill material instance between the IC device and the IC device carrier and between a bar of the lid-ridge and the IC device carrier, and curing the underfill and sintering the first nano particle metallic paste to form a first metallic connection between the lower contact and the first pad.

In yet another embodiment of the present invention, an electronic device includes an integrated circuit (IC) device carrier package. The IC device carrier package includes an IC device carrier, an IC device connected to the upper surface of the IC device carrier, a lid-ridge, and underfill. The IC device carrier includes a first pad and a second pad both upon an upper surface of the IC device carrier. The lid-ridge includes a lid-ridge bar and a first contact and a second contact both upon a carrier facing surface of the lid-ridge bar. The first contact is connected to the first pad by a first metalized connection. The second contact is connected to the second pad by a second metalized connection. The underfill is attached to a bottom surface of the IC device and to the upper surface of the IC device carrier and attached to the carrier facing surface of the lid-ridge bar and to the upper surface of the IC device carrier.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

An IC device package includes a carrier, one or more IC devices and a lid. The lid includes a lid-ridge. The lid is connected to the carrier by connecting the lid-ridge to the carrier with nano particle metallic paste, prior to connecting the IC device to the carrier. Subsequent to connecting the IC device to the carrier, the lid is connected to the lid-ridge with nano particle metallic paste, is connected to the carrier with seal-band material and is connected to the IC device with thermal interface material. In multi-IC device packages, the lid-ridge may be positioned upon the carrier between the IC devices.

Figure 1:
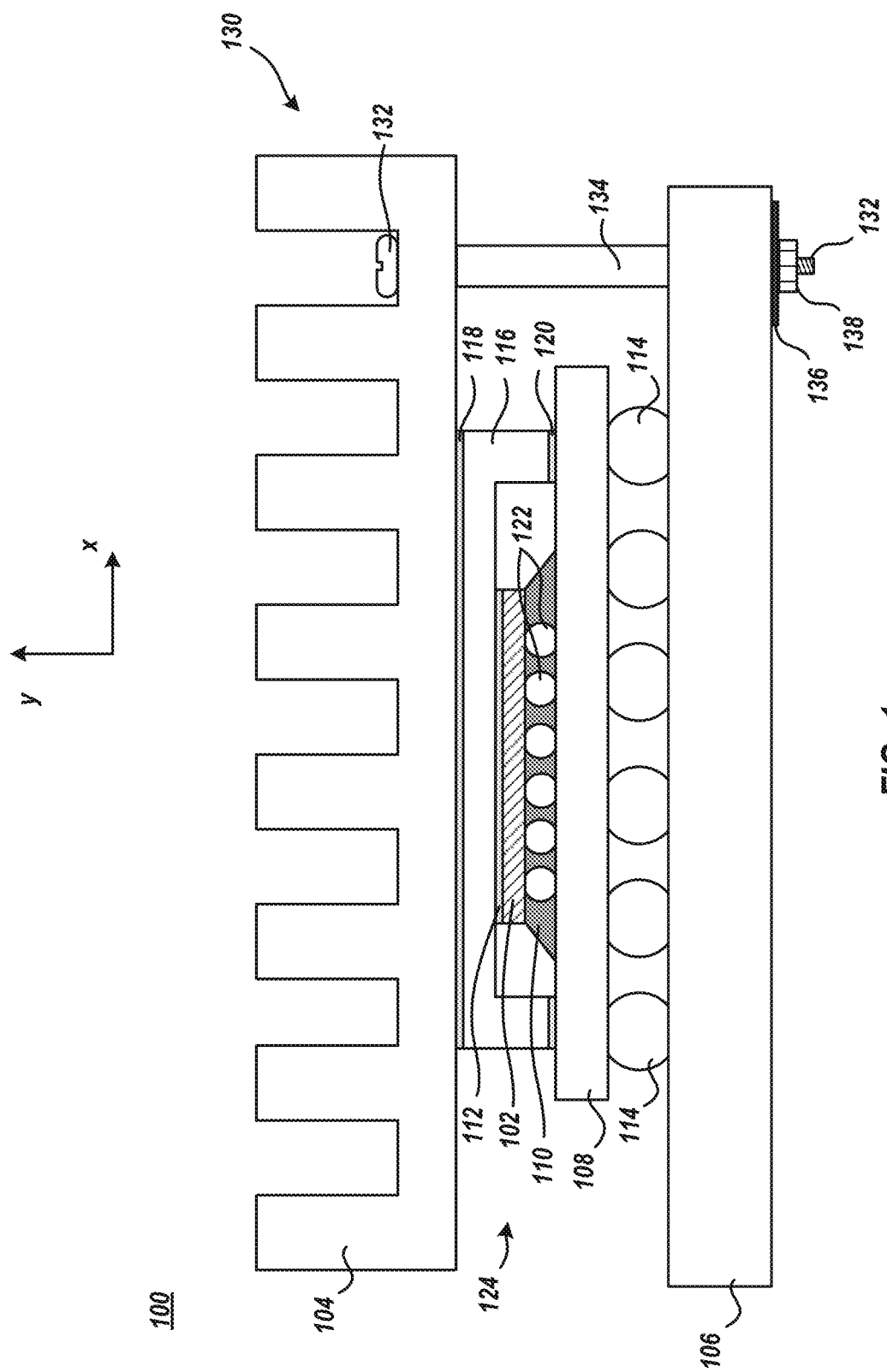
FIG. 1 depicts a prior art electronic system.

FIG. 1 depicts a prior art electronic system 100. Electronic system 100 may be for example a computer, server, etc. System 100 includes an IC chip module or package 124 that includes a chip 102, carrier 108, interconnects 122, underfill 110, thermal interface material 112, lid 116, and adhesive 120.

Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, or the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to chip 102. Generally, during operation of electronic device 100, heat needs to be removed from chip 102. In this situation, lid 116 is both a lid and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic device 100 and may include electronic components, such as a graphics processing unit, memory, hard drive storage, and the like, and may further provide connectors for other peripherals. Interconnects 114 electrically connect the lower side of carrier 108 to motherboard 106 and may be a wire bond, solder bond, stud, conductive ball, conductive button, land grid array (LGA) of complaint pins, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102 a heat sink 104 may be thermally joined to package 124 via thermal interface material 118. Heat sink 104 is a passive heat exchanger that cools chip 102 by dissipating heat into the surrounding air. As such, during operation of electronic device 100, a thermal path may exist from chip 102 to heat sink 104 through thermal interface material 112, lid 116, and thermal interface material 118, and the like. Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon package 124.

Figure 2:
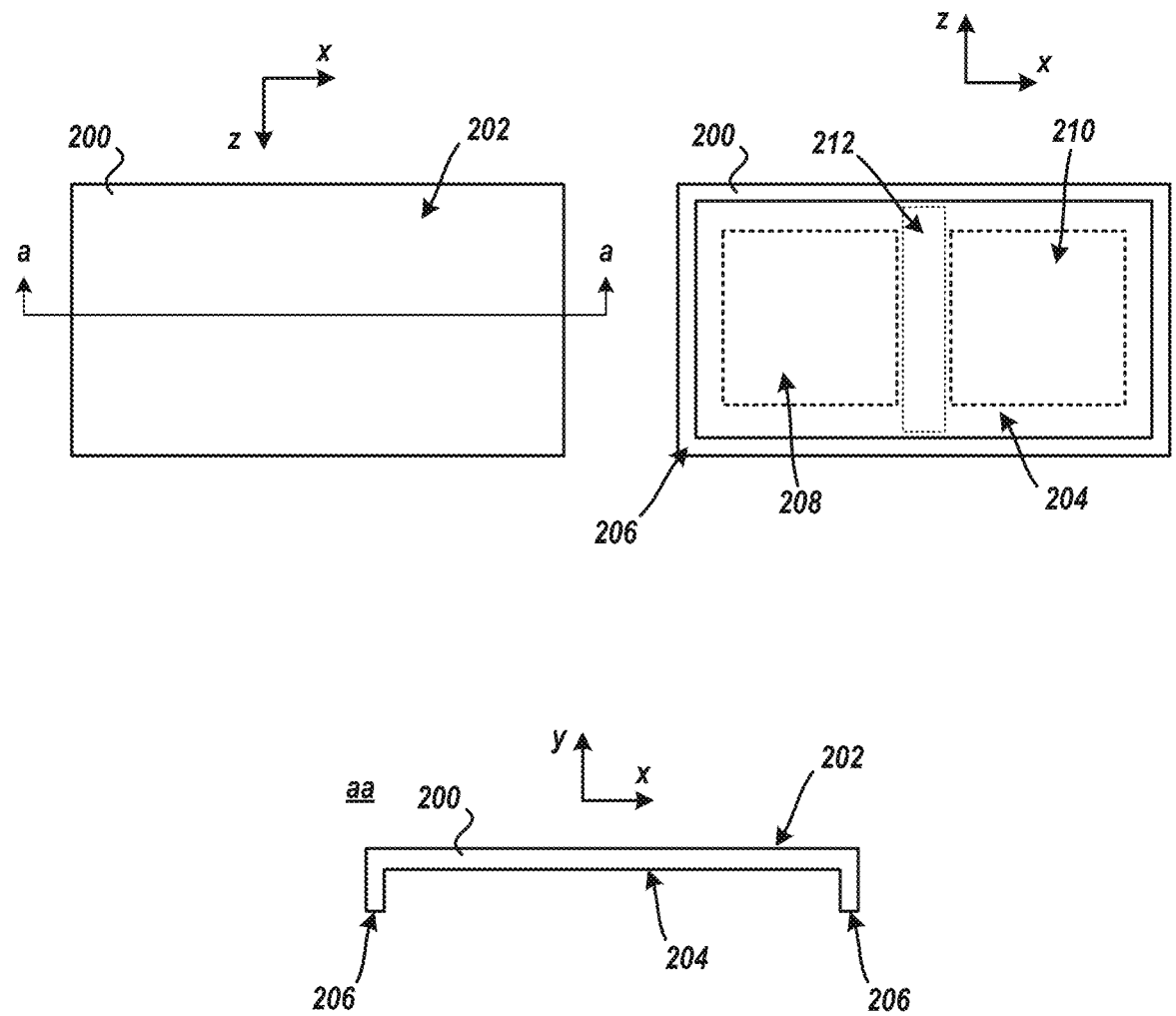
FIG. 2 depicts various views of an IC device package lid, according to one or more embodiments of the present invention.

FIG. 2 depicts various views of an IC device package lid 200, according to one or more embodiments of the present invention. Lid 200 is configured to be a component of the IC device package and to attach, contact, or otherwise connect with the carrier, with one or more IC devices, and with lid-ridge. Lid 200 includes a heat-sink facing surface 202, a carrier facing surface 206, an IC device facing surface 204. Lid 200 may further include various sidewalls, etc.

Heat-sink facing surface 202 may be configured to be horizontal (i.e. parallel with the x-axis) and may be configured to attach to a heatsink or other heat removal structure. Carrier facing surface 206 may be configured to be horizontal and may be configured to attach to the IC device carrier. Carrier facing surface 206 may further be configured to exist at the side surface perimeter of the lid 200 as is depicted. IC device facing surface 204 may be configured to be horizontal and may be configured to attach to one or more IC devices. For example, IC device facing surface 204 may include a first IC device region 208, a second IC device region 210, and an IC device intermediary region 212. The first IC device region 208 may be configured to attach to a first IC device and the second IC device region 210 may be configured to attach to a second IC device. The IC device intermediary region 212 is an area of IC device facing surface 204 between the first IC device region 208 and the second IC device region 210.

The lid 200 may be formed of a material with sufficient rigidity to maintain sufficient flatness or horizontal and/or vertical surfaces with a sufficiently high heat transfer coefficient to sufficiently remove heat from the one or more IC devices to which the lid may be connected. For example, the lid 200 may be formed of a metal such as Copper, Aluminum, or the like. The lid 200 may include a circumferential perimeter wall that encloses the IC devices internal to the wall. The perimeter wall may form carrier facing surface 206. The shape of the perimeter wall may be chosen based upon the desired shape or layout of the one or more IC devices upon the carrier.

Figure 3:
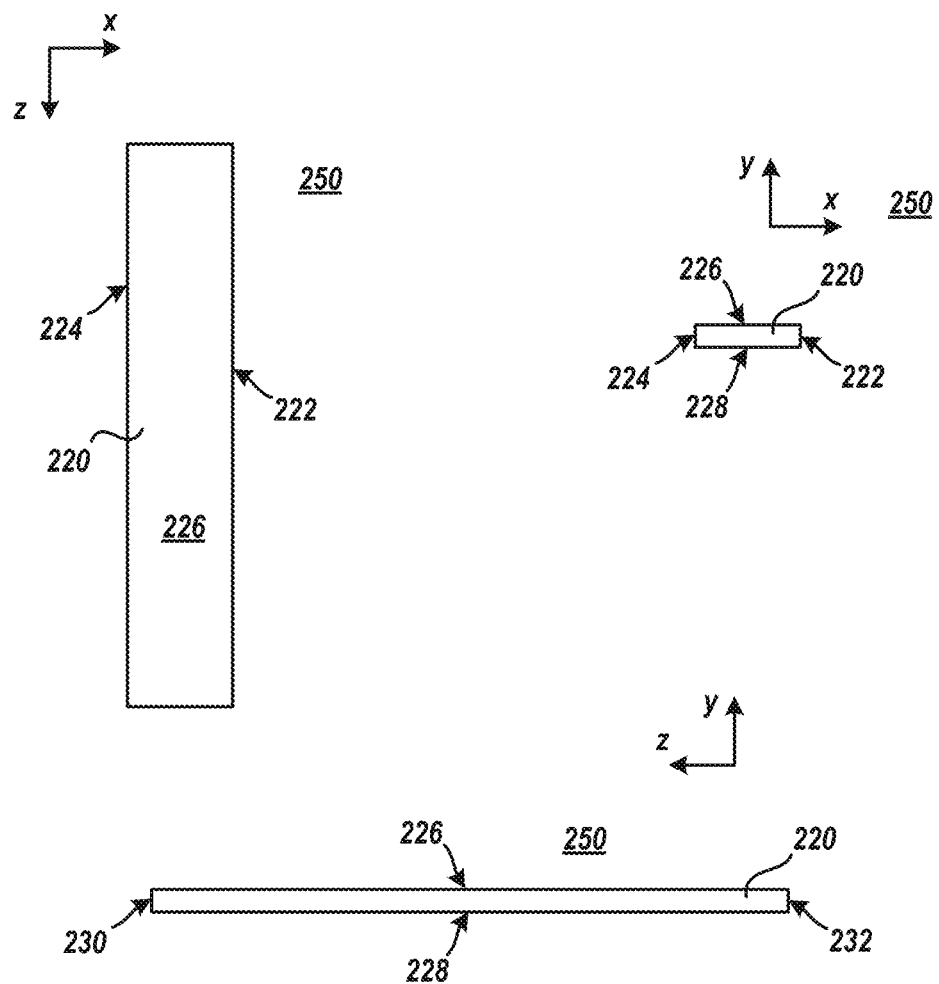
FIG. 3 depicts various views of a lid-ridge at a particular fabrication stage, according to one or more embodiments of the present invention.

FIG. 3 depicts various views of lid-ridge 250 at a particular fabrication stage, according to one or more embodiments of the present invention. At the present fabrication stage, a bar 220 of lid-ridge 250 is provided. Bar 220 includes a cover facing surface 226, a carrier facing surface 228, a sidewall 222, a sidewall 224, a front wall 230, and a rear wall 232. The shape and relative side of cover facing surface 226 and/or carrier facing surface 228 may be chosen to fit within IC device intermediary region 212 of cover 200. For example, cover facing surface 226 may have the same area as the IC device intermediary region 212. Cover facing surface 226 and carrier facing surface 228 may be configured to be horizontal and sidewall 222, sidewall 224, front wall 230, and rear wall 232 may be configured to be vertical (i.e. parallel with the y-axis).

The bar 220 may be formed of a material with sufficient rigidity to maintain sufficient flatness of horizontal and/or vertical surfaces with a sufficiently high heat transfer coefficient to sufficiently transfer heat from the IC device carrier to the lid 200. For example, the lid ridge bar 220 may be formed of a metal such as Copper, Aluminum, or the like.

Figure 4A:
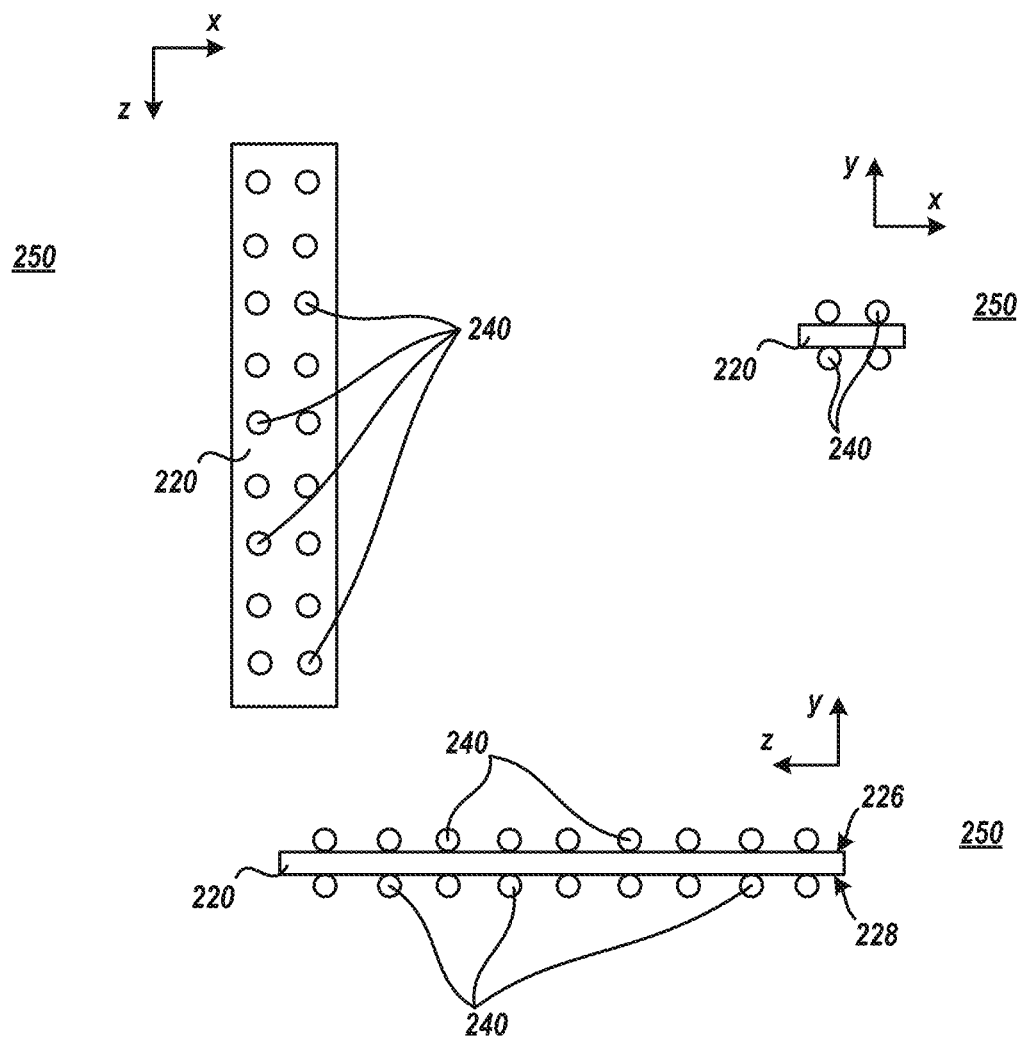
FIG. 4A and FIG. 4B depict various views of a lid-ridge at a particular fabrication stage, according to one or more embodiments of the present invention.
Figure 4B:
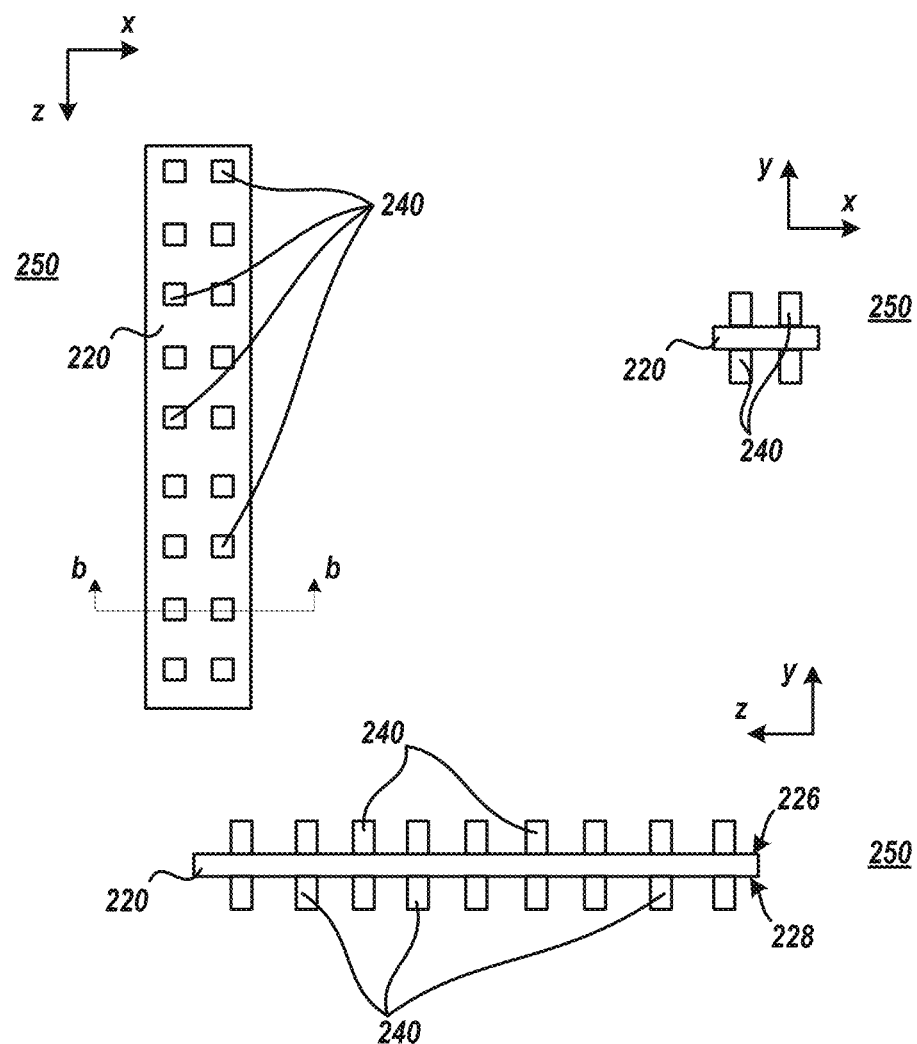

FIG. 4A and FIG. 4B depict various views of lid-ridge 250 at a particular fabrication stage, according to one or more embodiments of the present invention. At the present fabrication stage, contacts 240 are formed upon bar 220. Contacts 240 may be conductive balls, as is shown in FIG. 4A, conductive pillars, as is shown in FIG. 4A, or the like.

Figure 5:
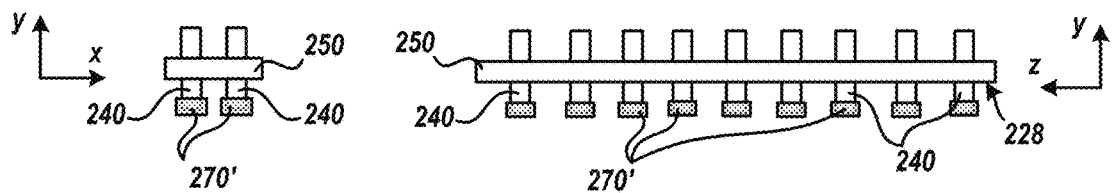
FIG. 5 depicts a side view of a lid-ridge with nano particle metallic paste formed thereupon, according to one or more embodiments of the present invention.

Contacts 240 may be formed upon bar 240 by additive processes that add conductive material to bar 220 such as plating, deposition, printing, or the like. Contacts 240 may be formed upon bar 240 by connective processes that connect conductive material to bar 220 such as joining, adhesively connecting, welding, soldering, or the like. Each contact 240 upon surface 228 may be positioned upon bar 220 to align with an associated contact of the IC device carrier (e.g., contact 334 as shown in FIG. 5). Contacts 240 may be positioned in an array of columns/rows upon surface 228. In some implementations, additional contacts 240 may be positioned in an array of columns/rows upon surface 226.

FIG. 5 depicts a side view of lid-ridge 250 with nano particle metallic paste 270' formed thereupon, according to one or more embodiments of the present invention. Nano particle metallic paste 270' may be formed upon the lid-ridge 250 contacts 240 by a dipping process. The dipping process may include forming a layer of a desired thickness of nano particle metallic paste 270' upon a substrate. The lid-ridge 250 may be dipped into the nano particle metallic paste 270'. In some instances, the contacts 240 may contact the substrate. Subsequently, the lid-ridge 250 may be removed from the substrate and nano particle metallic paste 270' structure. The nano particle metallic paste 270' in the immediate locations of the contacts 240 may transfer from the substrate onto the contacts 240.

Nano particle metallic paste 270' is a paste base material that includes metallic particles of either a single distribution of nano-particles or a bimodal distribution of micro and nano particles there within. For the bimodal distribution, the micro-particles are on the range of 1 to 10 um and nano-particles are from 100 to 500 nm. For the single distribution, the nano-particles are from 50 to 300 nm. For example, nano particle metallic paste 270' may be a Copper nano particle paste.

Figure 6:
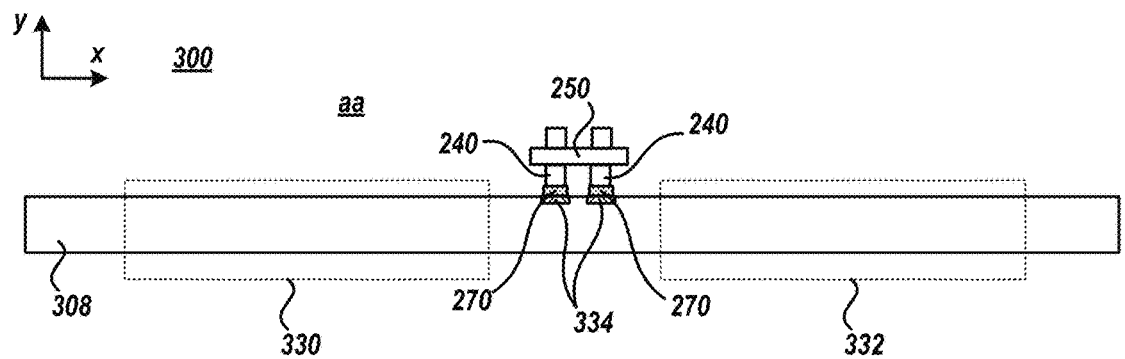
FIG. 6 depicts a cross section view of an IC device package at a particular fabrication stage, according to one or more embodiments of the present invention.

FIG. 6 depicts a cross section view of IC device package 300 at a particular fabrication stage, according to one or more embodiments of the present invention. At the present fabrication stage, lid-ridge 250 is connected to IC device carrier 308. Lid-ridge 250 may be connected to IC device carrier 308 by placing the lid-ridge 250 with respect to the carrier 308 such that each contact 240 aligns with a contact 335 of carrier 308, contacting each contact 240 with the associated contact 335 with the nano particle metallic paste 270', and sintering or otherwise heating the nano particle metallic paste 270' to form a metallic connection 270 between each contact 240 with the associated contact 335. The sintering or heating fabrication stage may be accomplished by a first heating chunk in contact with the upper surface(s) of lid-ridge 250 and a second heating chunk in contact with the lower surface(s) of carrier 308. The heating chunks may apply heat and compressive forces to the lid-ridge 250 and carrier 308 structure. After a sufficient temperature and time under pressure (e.g., 170 degrees Celsius for 20 minutes, or the like), the nano particle metallic paste 270' may sinter to metallic connection 270 that connects each contact 240 with its associated contact 334. Contact 334 may also be referred herein as pad 334, or the like.

Carrier 308 may be an organic carrier and provides mechanical support for one or more IC devices and electrical paths from one or more contacts on the upper surface of carrier 308 to one or more contacts on the opposing surface of carrier 308. For example, carrier 308 may include electrical paths there within connected from contacts on the upper surface of carrier 308 within a first IC device region 330 and contacts on the lower surface of carrier 308 within the region 330, as is known in the art. Likewise, carrier 308 may include electrical paths there within connected from contacts on the upper surface of carrier 308 within a second IC device region 332 and contacts on the lower surface of carrier 308 within the region 332, as is known in the art. Similarly, carrier 308 may include electrical paths there within connected from contacts 334 on the upper surface of carrier 308 and contacts on the lower surface of carrier 308. The contacts of carrier 308, such as contacts 334, may be formed in an array of rows and columns, as is known in the art.

Figure 7:
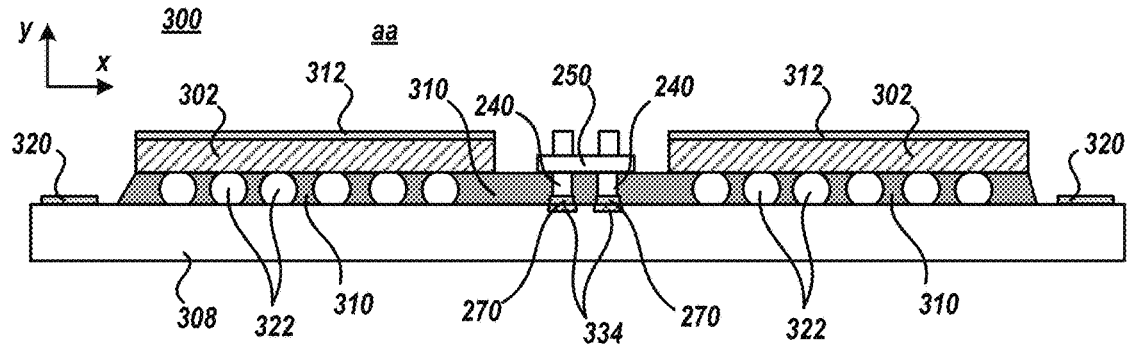
FIG. 7 depicts a cross section view of an IC device package at a particular fabrication stage, according to one or more embodiments of the present invention.

FIG. 7 depicts a cross section view of an IC device package 300 at a particular fabrication stage, according to one or more embodiments of the present invention. At the present fabrication stage, IC device 302 is joined to carrier 308, underfill 310 is formed between IC device 302 and carrier 308 and between bar 220 and carrier 308, thermal interface material 312 is formed upon the IC device 302, and seal band 320 is formed upon carrier 308.

One or more IC devices 302 may be joined to carrier 308 by joining a contact of IC device 302 with a contact on the upper surface of carrier 308 by an interconnect 322. Interconnects 322 electrically and mechanically connect IC device 302 and the upper side of carrier 308 and may be a wire bond, solder bond, stud, conductive ball, conductive button, or the like. When IC device 302 is seated upon carrier 308, a reflow process may be performed to electrically and mechanically join interconnects 322 to electrical contacts of both IC device 302 and carrier 308.

Underfill 310 may be formed between IC device 302 and carrier 308 and between bar 220 and carrier 308 by applying underfill material upon carrier 308 around the perimeter of IC device 302 and around the perimeter of lid-ridge 250. Capillary action may draw the underfill material around the perimeter of IC device 302 to underneath the IC device 302 between the IC device and carrier 308 and around the perimeter of lid-ridge 250 to underneath the lid-ridge 250 between the bar 220 and carrier 308. Underfill 310 may be electrically-insulating, may substantially surround interconnects 322 and/or contacts 240, may isolate individual interconnects 122 and/or contacts 240, may provide mechanical support between IC device 302 and carrier 308, and may provide mechanical support between lid-ridge 250 and carrier 308. Underfill 310 may also prevent damage to individual interconnects 322 and/or contacts 240 due to thermal expansion mismatches between IC device 302 and carrier 308. Underfill 310 may be a contiguous underfill instance meaning that there is a single instance of underfill material between both the IC device 302 and the IC carrier and the bar 220 and the carrier 308.

Thermal interface material 312 may be formed upon the IC device 302 may applying thermal interface material (TIM) such as thermal grease, thermal gel, or the like upon the upper surface of IC device 302. The TIM may be applied in a predetermined pattern (e.g. star pattern, or the like) so as to substantially cover the surface area of the upper surface of the IC device 302 upon when the cover 200 is applied thereto. Seal band 320 may be formed upon carrier 308 by applying the seal band material upon the carrier 320 around the perimeter of the IC device(s) 302 and lid-ridge 250.

In some implementations, surface 228 of lid-ridge bar 220 may be coplanar with the bottom or carrier facing surface of IC device 302.

Figure 8A:
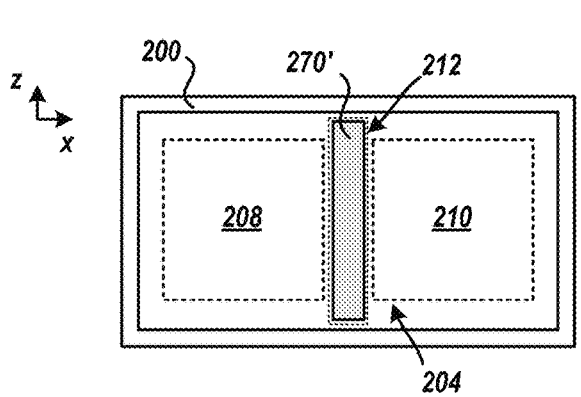
FIG. 8A and FIG. 8B depict various views of a lid at a particular fabrication stage, according to one or more embodiments of the present invention.
Figure 8B:
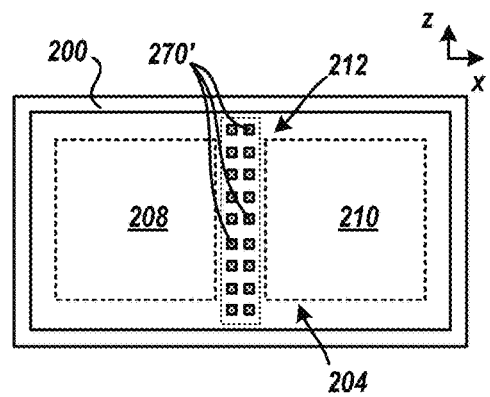

FIG. 8A and FIG. 8B depict various views of lid 200 at a particular fabrication stage, according to one or more embodiments of the present invention. At the present stage of fabrication, nano particle metallic paste 270' is applied to surface 204 of lid 200 within intermediary region 212. As shown in FIG. 8A, nano particle metallic paste 270' may be applied to surface 204 of lid 200 in substantially all of intermediary region 212. As shown in FIG. 8B, nano particle metallic paste 270' may be applied to surface 204 of lid 200 in an array or locations that would align with contacts 240 upon surface 226 of lid-ridge 250. Nano particle metallic paste 270' applied to lid 200 may be the same or different nano particle metallic paste 270' applied to lid-ridge 250.

Figure 9:
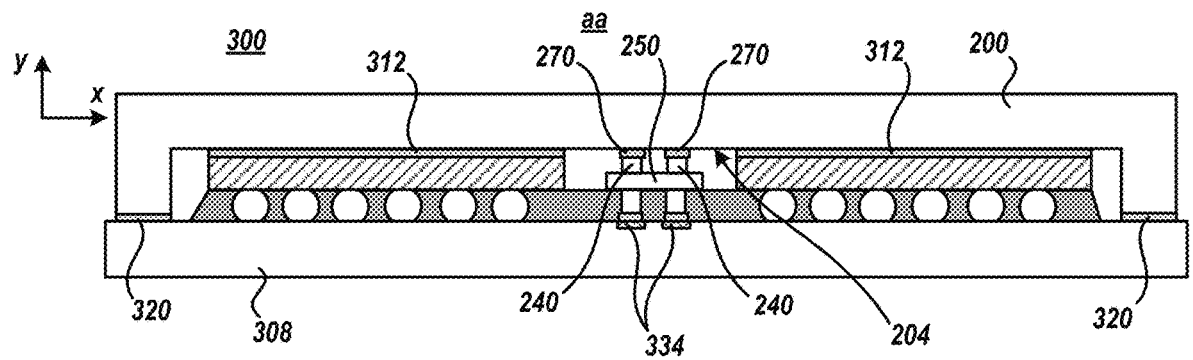
FIG. 9 depicts a cross section view of an IC device package at a particular fabrication stage, according to one or more embodiments of the present invention.

FIG. 9 depicts a cross section view of IC device package 300 at a particular fabrication stage, according to one or more embodiments of the present invention. At the present fabrication stage lid 200 is attached to package 300. Lid 200 may attach, contact, or otherwise connect with the carrier 308 by seal band 320 connecting surface 206 and carrier 308, lid 200 may attach, contact, or otherwise connect with IC device(s) 302 by TIM 312 connecting the IC device 302 and surface 204, lid 200 may attach, contact, or otherwise connect with lid-ridge 250 by metallic connection 270 connecting contact 240 and surface 204.

TIM 312 and seal band 320 may be cured and metallic connection 270 may be formed by a heating or curing process. Initially, lid 200 may be aligned to the carrier such that surface 206 is aligned with seal band 320 upon carrier 308. The lid may be lowered so that surface 206 contacts seal band, surface 204 contacts TIM 312, and such that nano particle metallic paste 270' previously applied to surface 204 becomes in contact with contacts 240 of lid-ridge 250.

TIM 312 and seal band 320 may be cured and metallic connection 270 may be formed by a heating or curing process where a first heating chunk contacts the upper surface(s) of lid 200 and a second heating chunk in contact with the lower surface(s) of carrier 308. The heating chunks may apply heat and compressive forces to the lid 200 and carrier 308 structure. After a sufficient temperature and time under pressure TIM 312 and seal band 320 may be cured (i.e., toughening or hardening of a polymer material by cross-linking of polymer chains) and the nano particle metallic paste 270' may sinter to metallic connection 270 that connects each contact 240 with surface 204 of lid 200.

One or more of the contacts 334 of IC device may be grounded. For example, an internal wiring line within carrier 308 at ground potential may be electrically connected to one or more of the contacts 334. As such, in certain implementations lid-ridge may be at ground potential. In these implementations, therefore, the lid-ridge 250 may electrically shield one IC device from another electrical device.

For clarity, the IC package 300 as depicted in FIG. 9 may be attached to or within an electronic device. For example, IC package 300 may replace package 124 as depicted in FIG. 1 to form an electronic system in accordance with the various embodiments of the present invention. As such, the IC package 300 may be apart of electronic device fabrication stages. For example, the lower surface of carrier 308 may be attached to motherboard 106 by interconnects 114, thermal interface material 112 may be applied to the top lid 200, and a heat sink 104 or other known heat removal device may be attached thereto.

Figure 10:
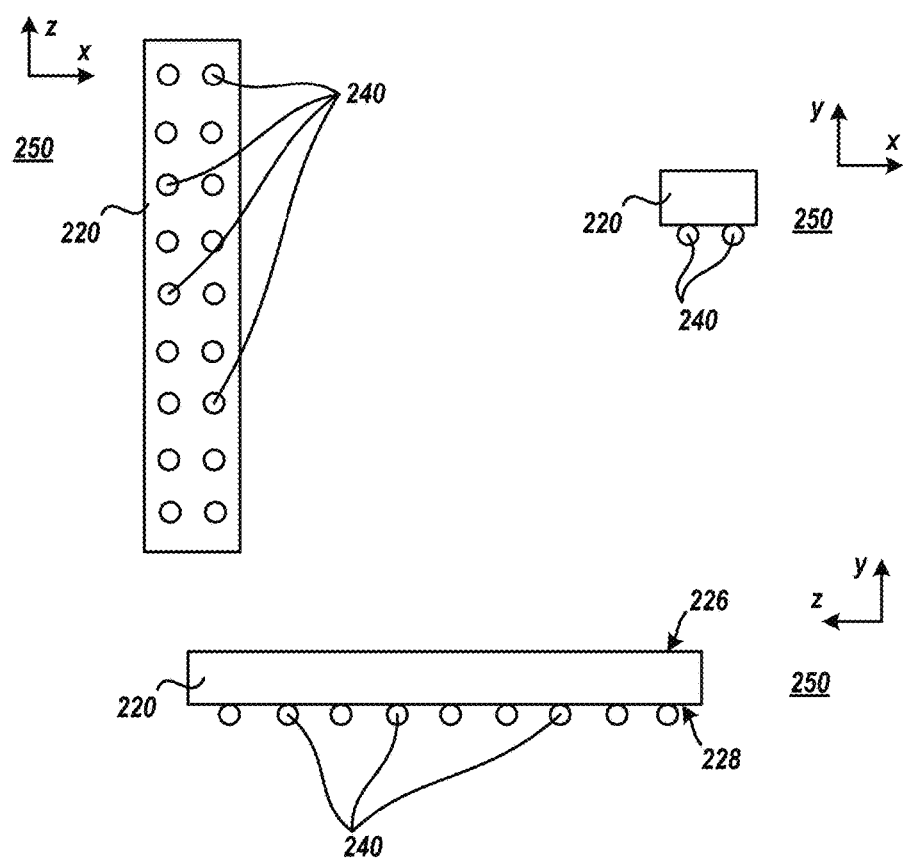
FIG. 10 depicts various views of a lid-ridge at a particular fabrication stage, according to one or more embodiments of the present invention.

FIG. 10 depicts various views of a lid-ridge at a particular fabrication stage, according to one or more embodiments of the present invention. At the present fabrication stage, contacts 240 are formed upon bar 220. Contacts 240 may be formed upon bar 240 by additive processes that add conductive material to bar 220 such as plating, deposition, printing, or the like. Contacts 240 may be formed upon bar 240 by connective processes that connect conductive material to bar 220 such as joining, adhesively connecting, welding, soldering, or the like. Each contact 240 upon surface 228 may be positioned upon bar 220 to align with an associated contact of the IC device carrier. Contacts 240 may be positioned in an array of columns/rows upon surface 228. In some implementations, such as is exemplarily depicted in FIG. 10, surface 226 of bar 220 may be void of contacts 240.

Figure 11:
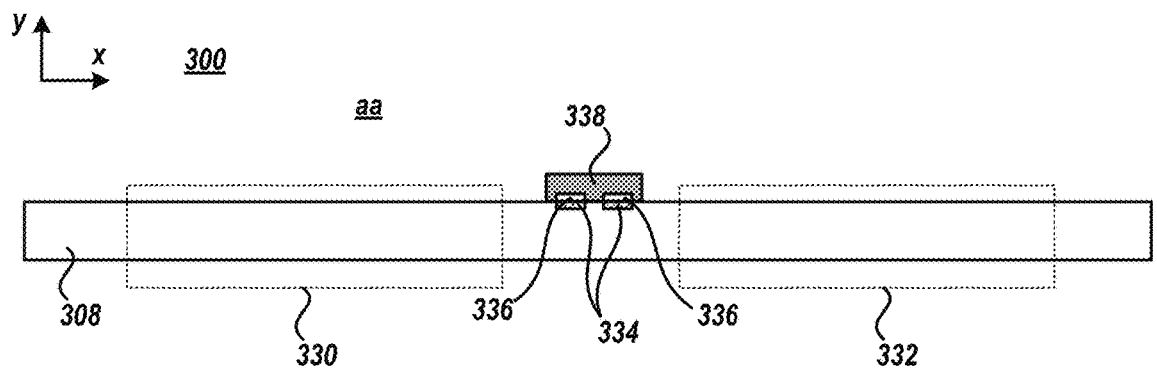
FIG. 11 through FIG. 15 depict cross section views of an IC device package at a particular fabrication stages, according to one or more embodiments of the present invention.

FIG. 11 depicts a cross section view of IC device package 300 at a particular fabrication stage, according to one or more embodiments of the present invention. At the present fabrication stage, no-flow fill 338 is applied to IC device carrier 308. In some implementations, barrier 336 may be formed upon those contacts 334 that which are covered by no-flow fill 338. The no-flow fill 338 may be applied to carrier 208 so that the surface area or shape of the upper surface of no-flow fill 338 is substantially similar to surface 228 of bar 220. No-flow fill 338 may be underfill material, adhesive, or the like. Barrier 336 may be a material that may be consumed at temperatures requisite for TIM 312 curing, seal band 320 curing, and/or metallic connection 270 formation, etc. A barrier 336 instance may be localized to the associated contact 334 such that the surface area of the upper surface of each barrier 336 instance is substantially similar to the surface area of the upper surface of the associated contact 334.

Figure 12:
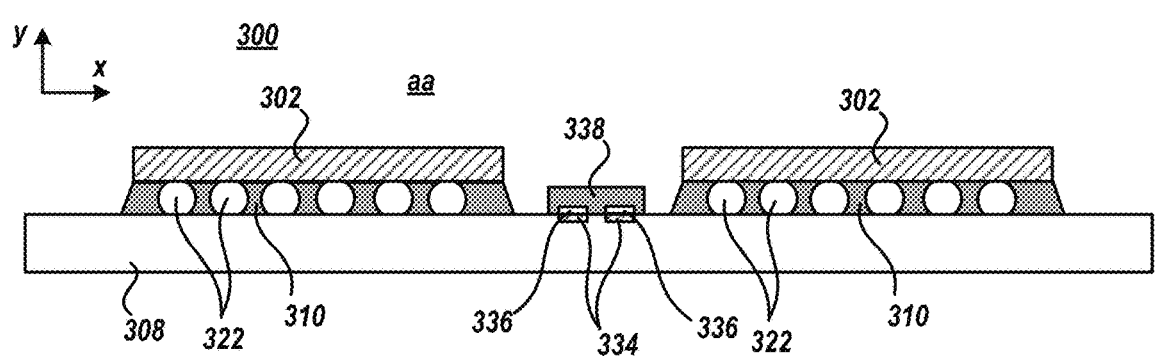

FIG. 12 depicts a cross section view of an IC device package 300 at a particular fabrication stage, according to one or more embodiments of the present invention. At the present fabrication stage, IC device 302 is joined to carrier 308 and underfill 310 is formed between IC device 302 and carrier 308.

One or more IC devices 302 may be joined to carrier 308 by joining a contact of IC device 302 with a contact on the upper surface of carrier 308 by an interconnect 322. Interconnects 322 electrically and mechanically connect IC device 302 and the upper side of carrier 308 and may be a wire bond, solder bond, stud, conductive ball, conductive button, or the like. When IC device 302 is seated upon carrier 308, a reflow process may be performed to electrically and mechanically join interconnects 322 to electrical contacts of both IC device 302 and carrier 308.

Underfill 310 may be formed between IC device 302 and carrier 308 by applying underfill material upon carrier 308 around the perimeter of IC device 302. Capillary action may draw the underfill material around the perimeter of IC device 302 to underneath the IC device 302 between the IC device 302 and carrier 308. Underfill 310 may be electrically-insulating, may substantially surround interconnects 322, may isolate individual interconnects 322, and may provide mechanical support between IC device 302 and carrier 308. Underfill 310 may also prevent damage to individual interconnects 322 due to thermal expansion mismatches between IC device 302 and carrier 308. A gap or void upon the top surface of carrier 308 may exist between underfill 310 and no-flow fill 338. In other words, a portion(s) of the upper surface of carrier 208 may be exposed between underfill 310 and no-flow fill 338.

Figure 13:
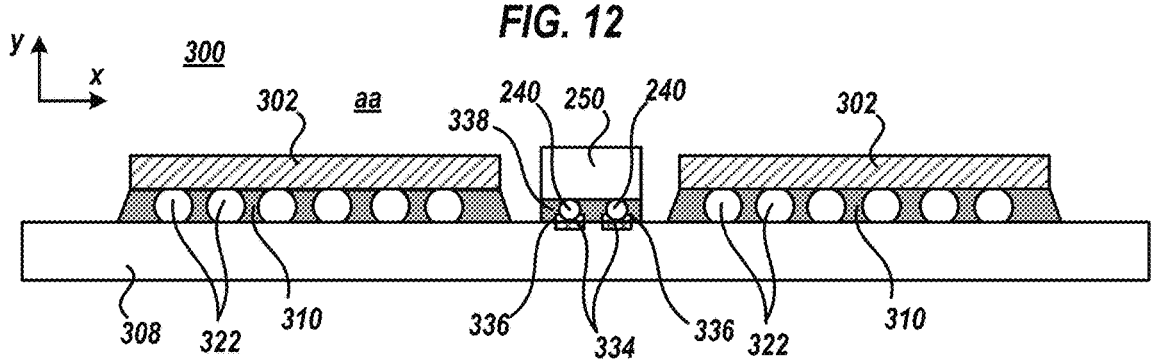

FIG. 13 depicts a cross section view of an IC device package 300 at a particular fabrication stage, according to one or more embodiments of the present invention. At the present fabrication stage, lid-ridge 250 is joined to carrier 308. Lid-ridge 250 may be connected to IC device carrier 308 by forcing contacts 240 of the lid-ridge 250 through no-flow fill 338 such that contacts 240 become in contact with barrier 336 (if present) or with contacts 334 (if barrier 336 is not present) and the upper surface of no-flow fill 338 becomes in contact with surface 228 of bar 220. In this manner, no-flow fill 338 may be formed between lid-ridge 250 and carrier 308. No-flow fill 338 may be electrically-insulating, may substantially surround contacts 240, may isolate individual contacts 240, and may provide mechanical support between lid-ridge 250 and carrier 308. No-flow fill 338 may also prevent damage to individual contacts 240 due to thermal expansion mismatches between lid-ridge 250 and carrier 308.

Figure 14:
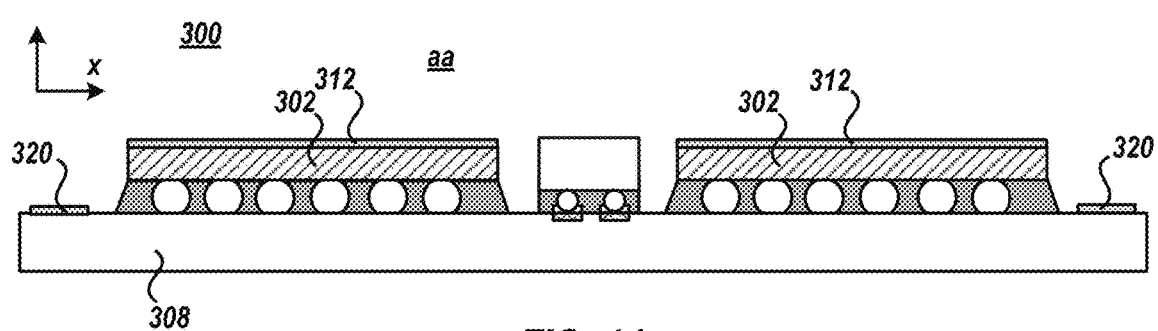

FIG. 14 depicts a cross section view of an IC device package 300 at a particular fabrication stage, according to one or more embodiments of the present invention. At the present fabrication stage, TIM 312 is formed upon IC device 302 and seal band 320 may be formed upon carrier 308. Thermal interface material 312 may be formed upon the IC device 302 by applying thermal interface material (TIM) such as thermal grease, thermal gel, or the like upon the upper surface of IC device 302. The TIM may be applied in a predetermined pattern (e.g. star pattern, or the like) so as to substantially cover the surface area of the upper surface of the IC device 302 upon when the cover 200 is applied thereto. Seal band 320 may be formed upon carrier 308 by applying the seal band material upon the carrier 320 around the perimeter of the IC device(s) 302 and lid-ridge 250.

Figure 15:
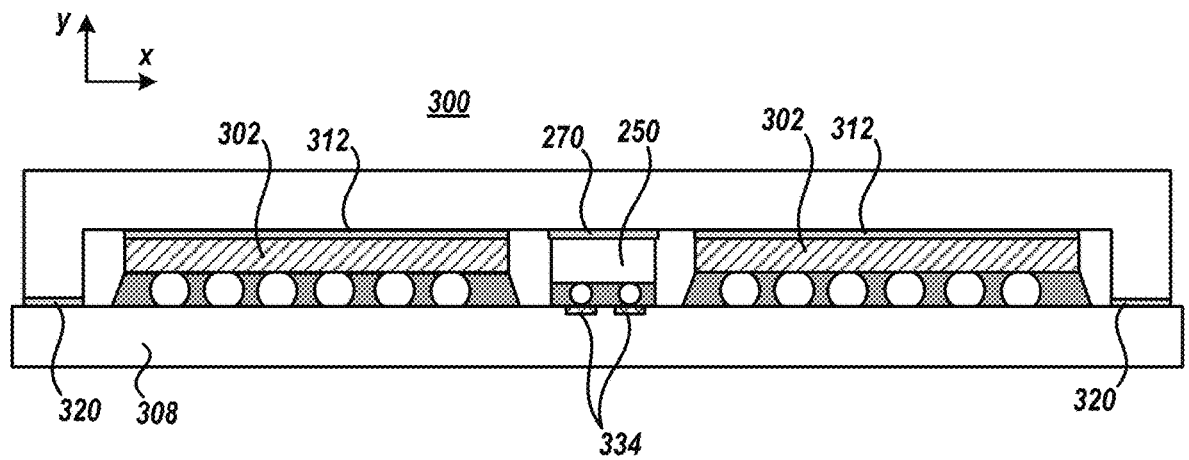

FIG. 15 depicts a cross section view of IC device package 300 at a particular fabrication stage, according to one or more embodiments of the present invention. At the present fabrication stage lid 200 is attached to package 300. Lid 200 may attach, contact, or otherwise connect with the carrier 308 by seal band 320 connecting surface 206 and carrier 308, by TIM 312 connecting the IC device 302 and surface 204, and/or by metallic connection 270 connecting surface 226 of lid-ridge 250 and surface 204 of cover 200.

TIM 312 and seal band 320 may be cured and metallic connection 270 may be formed by a heating or curing processes. Initially, lid 200 may be aligned to the carrier such that surface 206 is aligned with seal band 320 upon carrier 308. The lid may be lowered so that surface 206 contacts seal band, surface 204 contacts TIM 312, and such that nano particle metallic paste 270' previously applied to surface 204 becomes in contact with surface 226 of lid-ridge 250.

TIM 312 and seal band 320 may be cured and metallic connection 270 may be formed by a heating or curing process where a first heating chunk contacts the upper surface(s) of lid 200 and a second heating chunk in contact with the lower surface(s) of carrier 308. The heating chunks may apply heat and compressive forces to the lid 200 and carrier 308 structure. After a sufficient temperature and time under pressure TIM 312, seal band 320, and/or no-flow fill 338 may be cured and the nano particle metallic paste 270' may sinter to metallic connection 270 that connects lid-ridge 250 with lid 200. The heating of package 300 may consume the barrier 336 such that subsequent to the heating stage the contacts 240 are directly attached to associated contacts 334.

One or more of the contacts 334 of IC device may be grounded. For example, an internal wiring line(s) within carrier 308 at ground potential may be electrically connected to one or more of the contacts 334. One or more of the internal wiring line(s) may be wiring path(s) from the first IC device 302 or the second IC device or from the mother or system board (e.g. mother board 106). As such, in certain implementations lid-ridge may be at ground potential. In these implementations, therefore, the lid-ridge 250 may electrically shield one IC device from another electrical device.

For clarity, the IC package 300 as depicted in FIG. 15 may be attached to or within an electronic device. For example, IC package 300 may replace package 124 as depicted in FIG. 1 to form an electronic system in accordance with the various embodiments of the present invention. As such, the IC package 300 may be a part of electronic device fabrication stages. For example, the lower surface of carrier 308 may be attached to motherboard 106 by interconnects 114, thermal interface material 112 may be applied to the top lid 200, and a heat sink 104 or other known heat removal device may be attached thereto.

Figure 16:
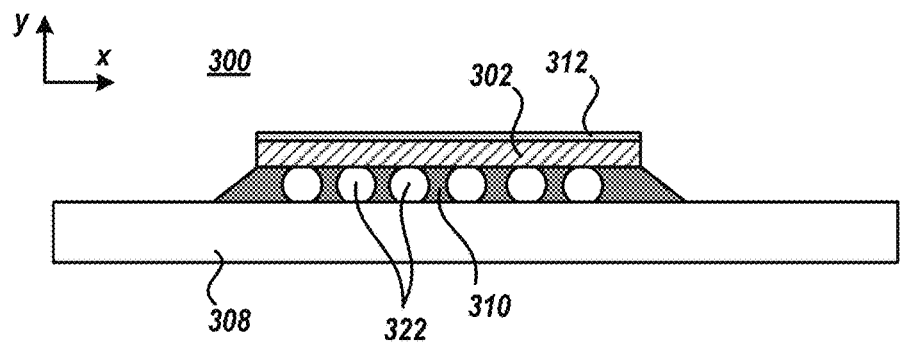
FIG. 16 depicts a cross section view of an IC device package at a particular fabrication stages, according to one or more embodiments of the present invention.

FIG. 16 depicts a cross section view of an IC device package 300 at a particular fabrication stage, according to one or more embodiments of the present invention. At the present stage of fabrication IC device 302 is joined to carrier 308, underfill 310 is formed between the IC device and carrier 308, and/or TIM 312 is formed upon the IC device 302.

Figure 17:
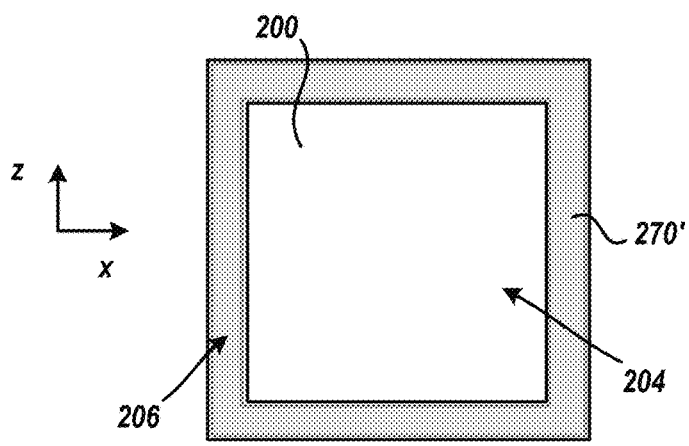
FIG. 17 depicts an underside view of a lid at a particular fabrication stage, according to one or more embodiments of the present invention.

FIG. 17 depicts an underside view of lid 200 at a particular fabrication stage, according to one or more embodiments of the present invention. At the present fabrication stage, nano particle metallic paste 270' is formed upon surface 206 of lid 200. Nano particle metallic paste 270' may be formed upon surface 206 by a dipping process. The dipping process may include forming a layer of a desired thickness of nano particle metallic paste 270' upon a substrate. The lid 200 may be dipped into the nano particle metallic paste 270'. Subsequently, the lid 200 may be removed from the substrate and nano particle metallic paste 270' structure. The nano particle metallic paste 270' in the immediate locations of surface 206 may transfer from the substrate onto surface 206 of lid 200.

Figure 18:
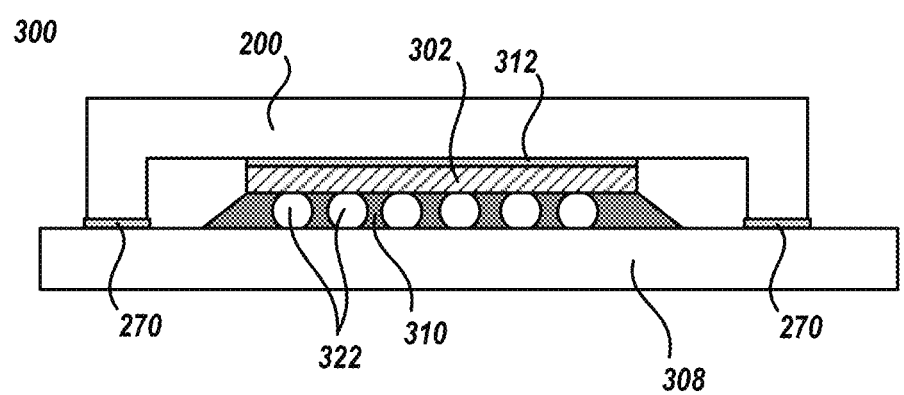
FIG. 18 depicts a cross section view of an IC device package at a particular fabrication stages, according to one or more embodiments of the present invention.

FIG. 18 depicts a cross section view of an IC device package 300 at a particular fabrication stages, according to one or more embodiments of the present invention. At the present stage of fabrication, lid 200 is attached to carrier 308. Lid 200 may be connected to IC device carrier 308 by aligning the lid 200 to the carrier 308, contacting surface 204 of the lid 200 and IC device 302 with TIM 312, contacting surface 206 of lid 200 and the upper surface of carrier 308 with the nano particle metallic paste 270', and sintering or otherwise heating the nano particle metallic paste 270' to form a metallic connection 270 between the lid 200 and the carrier 308. The sintering or heating fabrication stage may be accomplished by a first heating chunk in contact with the upper surface(s) of lid 200 and a second heating chunk in contact with the lower surface(s) of carrier 308. The heating chunks may apply heat and compressive forces to the lid 200 and carrier 308 structure. After a sufficient temperature and time under pressure, the nano particle metallic paste 270' may sinter to metallic connection 270 that connects lid 200 with carrier 308 and/or the TIM 312 may cure.

In some embodiments, where metallic connection 270 is desired to be a temporary connection, metallic connection 270 may be chemically dissolved, by e.g., a neutral pH Ammine based solution, or the like. Subsequent to dissolving metallic connection 270, lid 200 may be removed from IC device 302

Figure 19:
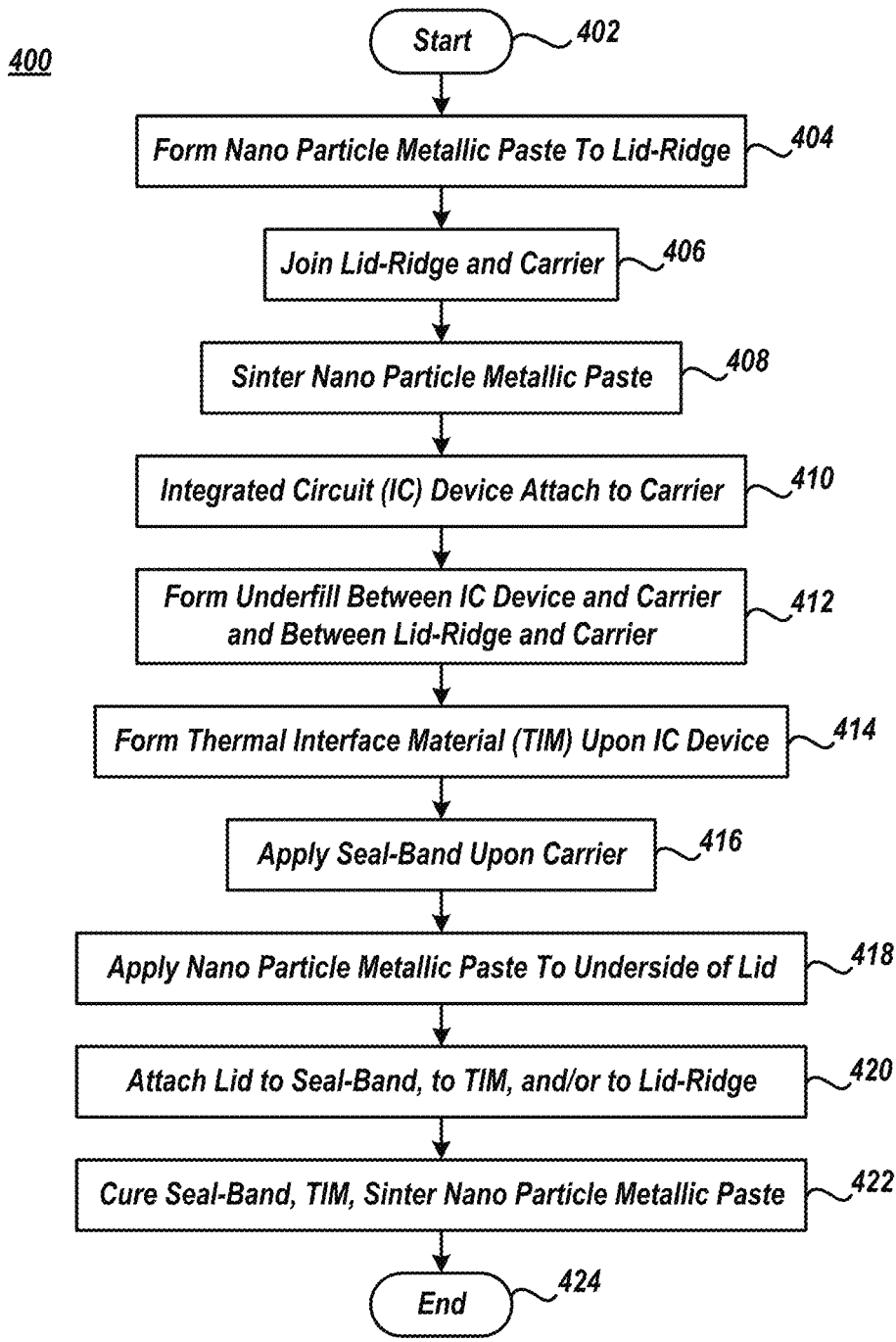
FIG. 19 depicts an IC device package fabrication method, according to one or more embodiments of the present invention.

FIG. 19 depicts an IC device package fabrication method 400, according to one or more embodiments of the present invention. Method 400 may be utilized to fabricate IC device package 300 as is exemplarily depicted in FIG. 9. Method 400 begins at block 402 and continues with forming nano particle metallic paste upon IC device carrier facing contacts of a lid-ridge (block 404). For example, nano particle metallic paste 270' is formed upon contacts 240 that are configured to face IC device carrier 308 of lid-ridge 250. In an implementation, the nano particle metallic paste 270' may be formed upon contacts 240 by dipping the contacts 240 into a layer of nano particle metallic paste 270' formed upon a substrate; whereby the nano particle metallic paste 270' may transfer to the contacts 240.

Method 400 may continue within joining, connecting, or otherwise contacting the lid-ridge and IC device carrier (block 406). For example, contacts 240 of the lid-ridge 200 may join to contacts 334 of IC device carrier 308 by way of the nano particle metallic paste 270'. In an implementation, one or more contacts 240 may be joined with one or more contacts 334 by the respective nano particle metallic paste 270' that was previously applied to the contact 240.

Method 400 may continue with sintering the nano particle metallic paste 270' forming a metallic and conductive connection between the lid-ridge and IC device carrier (block 408). For example, metallic connection 270 is formed between the contact 240 and the contact 334 by sintering or heating the nano particle metallic past 270'. The sintering or heating fabrication stage may be accomplished by a first heating chunk in contact with the upper surface(s) of lid-ridge 250 and a second heating chunk in contact with the lower surface(s) of carrier 308. The heating chunks may apply heat and compressive forces to the lid-ridge 250 and carrier 308 structure. After a sufficient temperature and time under pressure (e.g., 170 degrees Celsius for 20 minutes, or the like), the nano particle metallic paste 270' may sinter to metallic connection 270 that connects each contact 240 with its associated contact 334.

Method 400 may continue with attaching an IC device to the IC device carrier (block 410). For example, IC device 302 is joined to IC device carrier 208 via interconnects 322. One or more IC devices 302 may be joined to carrier 308 by joining a contact of IC device 302 with a contact on the upper surface of carrier 308 by an interconnect 322. When IC device 302 is seated upon carrier 308, a reflow process may be performed to electrically and mechanically join interconnects 322 to respective electrical contacts of both IC device 302 and carrier 308.

Method 400 may continue with forming underfill between the IC device and the IC device carrier and between the lid-ridge and the IC device carrier (block 412). Underfill 310 may be formed between IC device 302 and carrier 308 and between bar 220 and carrier 308 by applying underfill material upon carrier 308 around the perimeter of IC device 302 and around the perimeter of lid-ridge 250. Capillary action may draw the underfill material around the perimeter of IC device 302 to underneath the IC device 302 between the IC device and carrier 308 and around the perimeter of lid-ridge 250 to underneath the lid-ridge 250 between the carrier facing surface of bar 220 and carrier 308.

Method 400 may continue with forming TIM upon the IC device. For example, TIM 312 is formed in a pattern upon the upper surface of IC device 302 (block 414). TIM 312 may be formed upon the IC device 302 may applying TIM, such as thermal grease, thermal gel, or the like upon the upper surface of IC device 302. The TIM may be applied in a predetermined pattern (e.g. star pattern, or the like) so as to substantially cover the surface area of the upper surface of the IC device 302 upon when the cover 200 is applied thereto.

Method 400 may continue form forming a seal band upon the IC device carrier (block 416). For example, seal band 320 may be formed upon the carrier 208 around the perimeter of the IC device(s) 302.

Method 400 may continue with forming nano particle metallic paste upon the underside of a lid (block 418). For example, nano particle metallic paste 270' is applied to surface 204 of lid 200 within intermediary region 212. Nano particle metallic paste 270' may be applied to surface 204 of lid 200 in substantially all of intermediary region 212. Nano particle metallic paste 270' may be applied to surface 204 of lid 200 in an array or locations that would align with contacts 240 upon surface 226 of lid-ridge 250.

Method 400 may continue with attaching the lid to the IC device, to the ID device carrier, and/or to the lid-ridge (block 420). For example, the lid 200 may be attached to the IC device 302 by the TIM 312, the lid 200 may be attached to the lid-ridge 250 by nano particle metallic paste 270' that joins contacts 240 of lid-ridge 250 and lid 200, and/or the lid 200 may be attached to the carrier 308 by seal band 322.

Method 400 may continue with curing seal-band and/or TIM and sinter nano particle metallic paste thereby forming a metallic and conductive connection (block 422). For example, seal band 322 may be cured, TIM 312 may be cured, and metallic connection 270 may be formed by sintering nano particle metallic paste 270', thereby forming metallic connection 270. TIM 312 and seal band 320 may be cured and metallic connection 270 may be formed by a heating or curing process where a first heating chunk contacts the upper surface(s) of lid 200 and a second heating chunk in contact with the lower surface(s) of carrier 308. The heating chunks may apply heat and compressive forces to the lid 200 and carrier 308 structure. After a sufficient temperature and time under pressure TIM 312 and seal band 320 may be cured and the nano particle metallic paste 270' may sinter to metallic connection 270 that connects respective contact 240 with surface 204 of lid 200. Method 400 ends at block 424.

Figure 20:
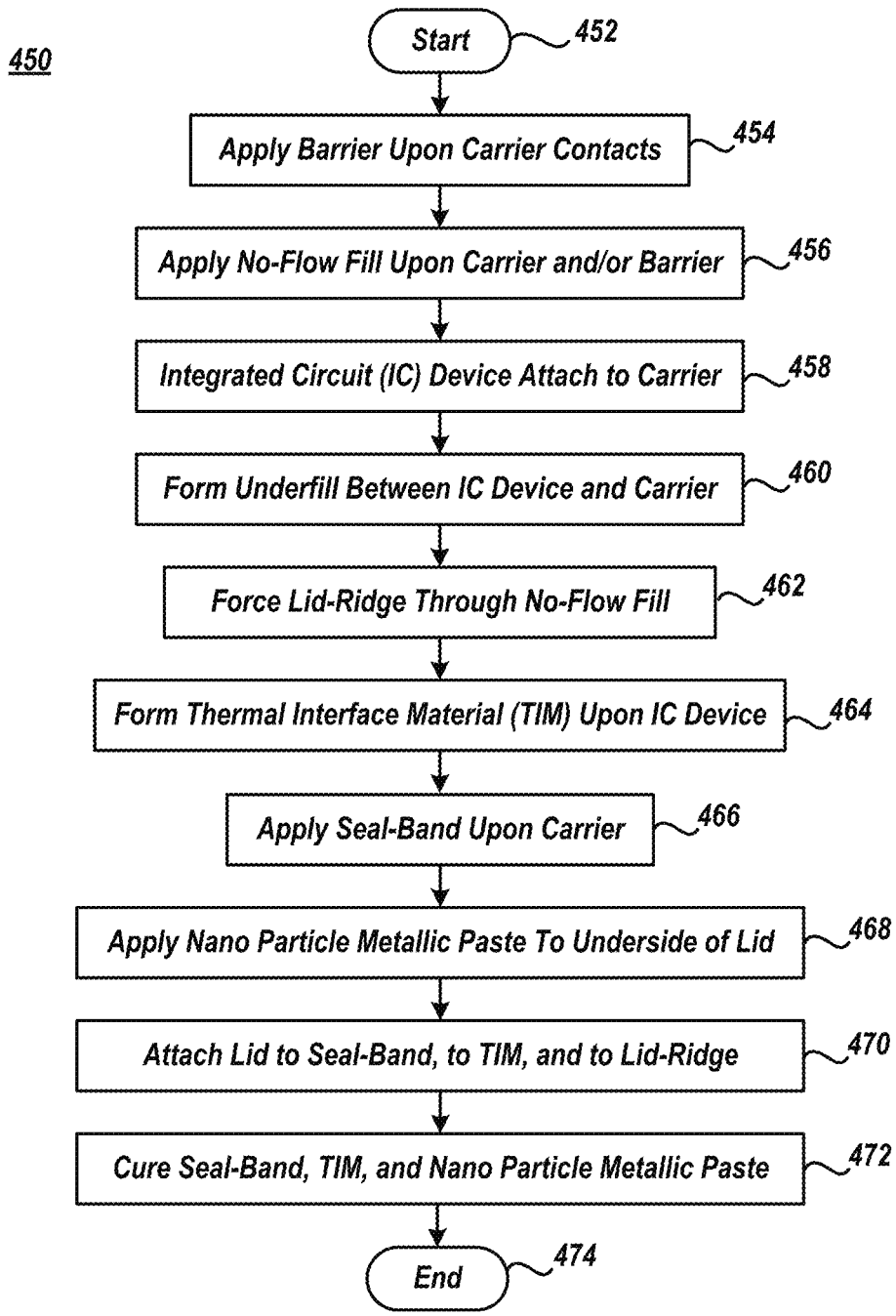
FIG. 20 depicts an IC device package fabrication method, according to one or more embodiments of the present invention.

FIG. 20 depicts an IC device package fabrication method 450, according to one or more embodiments of the present invention. Method 450 may be utilized, for example, to fabricate IC device package 300 as depicted in FIG. 15.

Method 450 begins at block 452 and may continue with forming a barrier upon each contact of IC device carrier to which are to be connected to a lid-ridge (block 454). For example, barrier 336 may be formed upon those contacts 334 that which are to be covered by no-flow fill 338. A barrier 336 instance may be localized to the associated contact 334 such that the surface area of the upper surface of each barrier 336 instance is substantially similar to the surface area of the upper surface of the associated contact 334.

Method 450 may continue with forming a no-flow fill upon the IC device carrier and/or upon the barrier (block 456). For example, no-flow fill 338 may be applied to carrier 208 so that the surface area or shape of the upper surface of no-flow fill 338 is substantially similar to surface 228 of bar 220.

Method 450 may continue with attaching an IC device to the IC device carrier (block 458). For example, one or more IC devices 302 may be joined to carrier 308 by joining a contact of IC device 302 with a contact on the upper surface of carrier 308 by an interconnect 322. When IC device 302 is seated upon carrier 308, a reflow process may be performed to electrically and mechanically join interconnects 322 to electrical contacts of both IC device 302 and carrier 308.

Method 450 may continue with forming underfill between the IC device and IC device carrier (block 460). For example, underfill 310 may be formed between IC device 302 and carrier 308 by applying underfill material upon carrier 308 around the perimeter of IC device 302. Capillary action may draw the underfill material around the perimeter of IC device 302 to underneath the IC device 302 between the IC device 302 and carrier 308. A gap or void upon the top surface of carrier 308 may exist between underfill 310 and no-flow fill 338. In other words, a portion(s) of the upper surface of carrier 208 may be exposed between underfill 310 and no-flow fill 338.

Method 450 may continue with forcing the lid-ridge through the no-flow fill (block 462). For example, lid-ridge 250 may be connected to IC device carrier 308 by forcing contacts 240 of the lid-ridge 250 through no-flow fill 338 such that contacts 240 become in contact with barrier 336 (if present) or with contacts 334 (if barrier 336 is not present) and the upper surface of no-flow fill 338 becomes in contact with surface 228 of bar 220. In this manner, no-flow fill 338 may be formed between lid-ridge 250 and carrier 308.

Method 450 may continue with forming a TIM upon the IC device (block 464) and forming a seal band (block 466) upon the IC device carrier. For example, TIM 312 is formed upon IC device 302 and seal band 320 may be formed upon carrier 308. Thermal interface material 312 may be formed upon the IC device 302 by applying thermal interface material (TIM) such as thermal grease, thermal gel, or the like upon the upper surface of IC device 302. The TIM may be applied in a predetermined pattern (e.g. star pattern, or the like) so as to substantially cover the surface area of the upper surface of the IC device 302 upon when the cover 200 is applied thereto. Seal band 320 may be formed upon carrier 308 by applying the seal band material upon the carrier 320 around the perimeter of the IC device(s) 302

Method 450 may continue with forming nano particle metallic paste to the underside of a lid (block 468). For example, nano particle metallic paste 270' is applied to surface 204 of lid 200 within intermediary region 212. Nano particle metallic paste 270' may be applied to surface 204 of lid 200 in substantially all of intermediary region 212. Nano particle metallic paste 270' may be applied to surface 204 of lid 200 in an array or locations that would align with contacts 240 upon surface 226 of lid-ridge 250.

Method 450 may continue with attaching the lid to the IC device, to the ID device carrier, and/or to the lid-ridge (block 470). For example, the lid 200 may be attached to the IC device 302 by the TIM 312, the lid 200 may be attached to the lid-ridge 250 by nano particle metallic paste 270' that joins lid-ridge 250 and lid 200, and/or the lid 200 may be attached to the carrier 308 by seal band 322.

Method 400 may continue with curing seal-band and/or TIM and sinter nano particle metallic paste thereby forming a metallic and conductive connection (block 472). For example, seal band 322 may be cured, TIM 312 may be cured, and metallic connection 270 may be formed by sintering nano particle metallic paste 270', thereby forming metallic connection 270. TIM 312 and seal band 320 may be cured and metallic connection 270 may be formed by a heating or curing process where a first heating chunk contacts the upper surface(s) of lid 200 and a second heating chunk in contact with the lower surface(s) of carrier 308. The heating chunks may apply heat and compressive forces to the lid 200 and carrier 308 structure. After a sufficient temperature and time under pressure TIM 312 and seal band 320 may be cured and the barrier (if present) may be consumed to allow for the nano particle metallic paste 270' to sinter to metallic connection 270 that connects respective contact 240 with surface 204 of lid 200. Method 450 ends at block 474.

Figure 21:
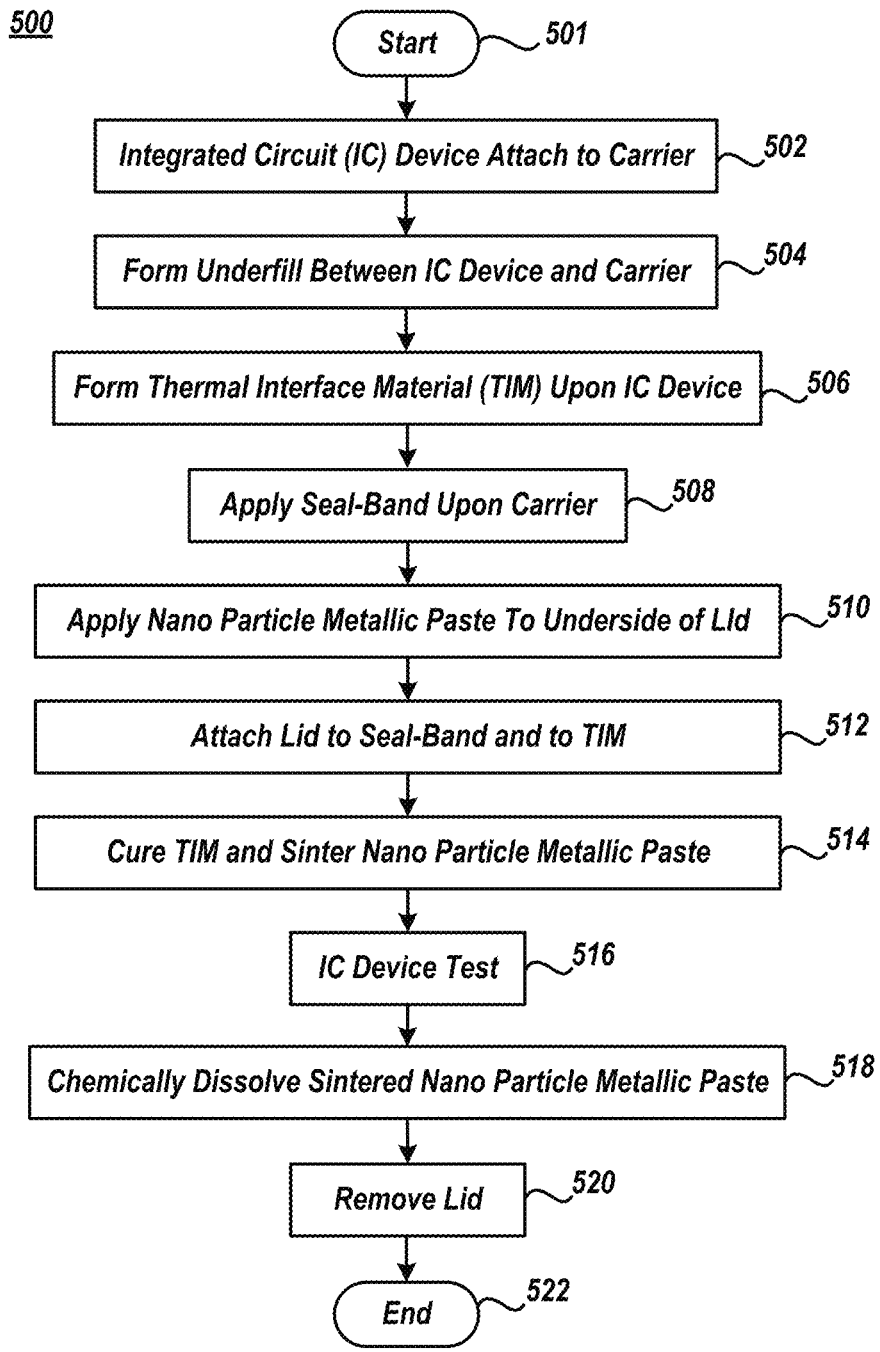
FIG. 21 depicts an IC device package fabrication method, according to one or more embodiments of the present invention.

FIG. 21 depicts an IC device package fabrication method 500, according to one or more embodiments of the present invention. Method 500 may be utilized, for example, to fabricate, test, and/or rework the IC device 300 depicted in FIG. 18.

Method 500 begins at block 501 and may continue with attaching an IC device to an IC device carrier (block 502). For example, one or more IC devices 302 may be joined to carrier 308 by joining a contact of IC device 302 with a contact on the upper surface of carrier 308 by an interconnect 322. When IC device 302 is seated upon carrier 308, a reflow process may be performed to electrically and mechanically join interconnects 322 to electrical contacts of both IC device 302 and carrier 308.

Method 500 may continue with forming underfill between the IC device and the IC device carrier (block 504). For example, underfill 310 may be formed between IC device 302 and carrier 308 by applying underfill material upon carrier 308 around the perimeter of IC device 302. Capillary action may draw the underfill material around the perimeter of IC device 302 to underneath the IC device 302 between the IC device 302 and carrier 308.

Method 500 may continue with forming a TIM upon the IC device (block 506) and forming a seal band upon the IC device carrier (block 508). For example, TIM 312 is formed upon IC device 302 and seal band 320 may be formed upon carrier 308. Thermal interface material 312 may be formed upon the IC device 302 by applying TIM upon the upper surface of IC device 302. The TIM may be applied in a predetermined pattern so as to substantially cover the surface area of the upper surface of the IC device 302 upon when the cover 200 is applied thereto. Seal band 320 may be formed upon carrier 308 by applying the seal band material upon the carrier 320 around the perimeter of the IC device(s) 302.

Method 500 may continue with applying nano particle metallic paste to the lid (block 510). For example, nano particle metallic paste 270' is applied to surface 206 of lid 200. Nano particle metallic paste 270' may be applied to substantially all or portions of surface 206 of lid 200. In certain implementations, lid 200 may be dipped into a layer of particle metallic paste 270' that is upon a substrate. The lid 200 may be removed whereby particle metallic paste 270' transfers onto surface 206 and optionally also transfers onto sidewalls associated with surface 206.

Method 500 may continue with attaching lid to the IC device carrier and/or to the IC device (block 514). For example, the lid 200 may be attached to the IC device 302 by the TIM 312 and/or the lid 200 may be attached to the carrier 308 by nano particle metallic paste 270'.

Method 500 may continue with curing the TIM and/or sinering the nano particle metallic paste 270'. For example, TIM 312 may be cured and metallic connection 270 may be formed by sintering nano particle metallic paste 270', thereby forming metallic connection 270. TIM 312 and may be cured and metallic connection 270 may be formed by a heating or curing process where a first heating chunk contacts the upper surface(s) of lid 200 and a second heating chunk in contact with the lower surface(s) of carrier 308. The heating chunks may apply heat and compressive forces to the lid 200 and carrier 308 structure. After a sufficient temperature and time under pressure TIM 312 may be cured and nano particle metallic paste 270' sinters to form metallic connection 270 that connects lid 200 with IC device carrier 308.

Method 500 may continue with testing or otherwise utilizing IC device (block 516). For example, IC device 302 is utilized to handle, operate upon, process, or the like, data. Method 500 may continue with chemically dissolving the metallic connection 270 (block 518). For example, metallic connection 270 may be chemically dissolved, by e.g., a neutral pH Ammine based solution, or the like. Method 500 may continue with removing lid from the IC device carrier (block 520). For example, lid 200 is removed so that lid 200 no longer contacts IC device 302 or carrier 308. Method 500 may end at block 522.

Figure 22:
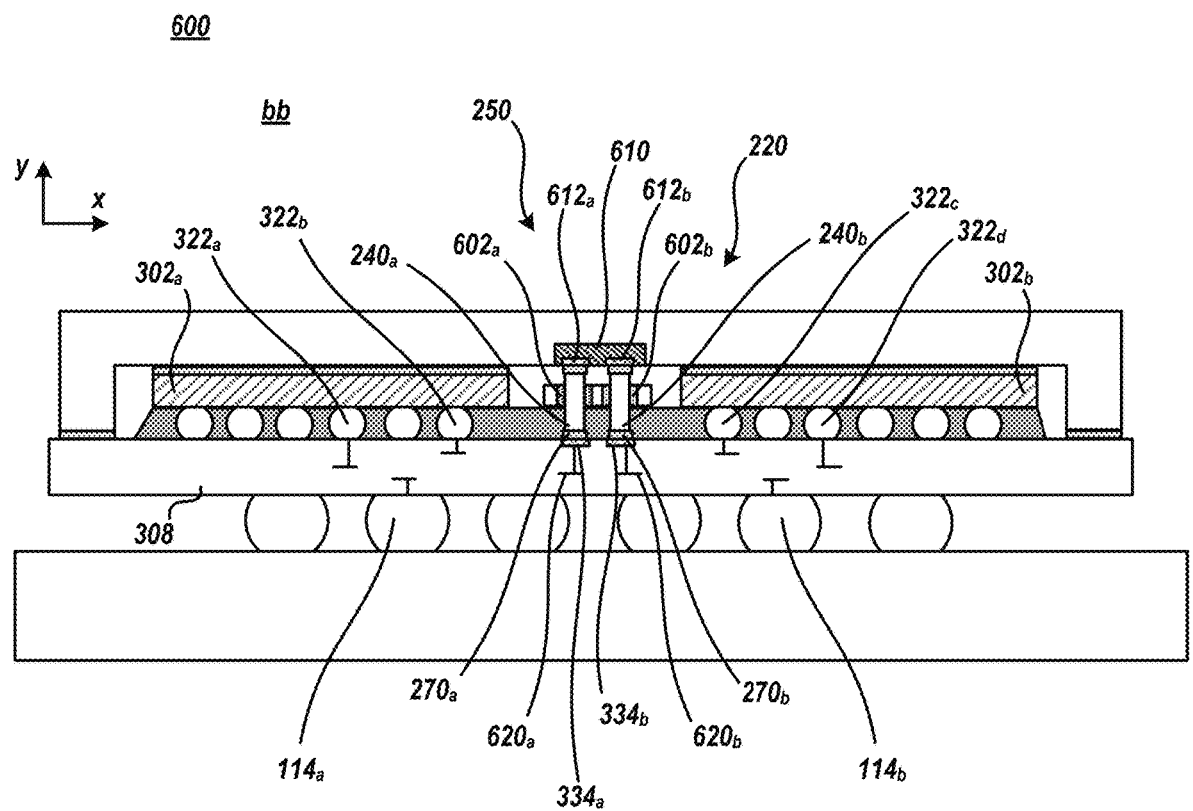
FIG. 22 depicts a cross section view of an electronic system, according to one or more embodiments of the present invention.

FIG. 22 depicts a cross section view of an electronic system 600, according to one or more embodiments of the present invention. Electronic system 600 includes an IC device 302$_a$, an IC device 302$_b$, a carrier 308, a mother board 106, a lid-ridge 250, and a cover 200. Cover 200 includes a discrete capacitor 610 mounted upon or within surface 204. Capacitor 610 includes a pad 612$_a$ and a pad 612$_b$. Lid-ridge 250 includes an electrically insulated contact 240$_a$ and an electrically insulated contact 240$_b$. Contacts 240*a*, 240*b* may extend through bar 220 and are insulated from bar 220 by an insulator 602$_a$, 602$_b$, respectively.

Contact 240$_a$ is connected to contact 334$_a$ of carrier 308 by metallic connection 270$_a$ which may be formed by one or more of the processes disclosed herein. Contact 240$_a$ is also connected to pad 612$_a$ by metallic connection 270$_c$ which also may be formed by one or more of the processes disclosed herein. Contact 334$_a$ is connected to a wiring line 620$_a$ within carrier 308. Pad 612$_a$ of capacitor 610 is connected to a first capacitor plate and pad 612$_b$ of capacitor 610 is connected to a second capacitor plate separated from the first capacitor plate by an insulator.

Contact 240$_b$ is connected to contact 334$_b$ of carrier 308 by metallic connection 270$_b$ which may be formed by one or more of the processes disclosed herein. Contact 240$_b$ is also connected to pad 612$_b$ by metallic connection 270$_d$ which also may be formed by one or more of the processes disclosed herein. Contact 33$_b$ is connected to a wiring line 620$_b$ within carrier 308.

Wiring line 620$_a$ may be connected to IC device 302$_a$ by way of interconnect 322$_b$ or interconnect 322$_a$ or may be connected to IC device 302$_b$ by way of interconnect 322 or interconnect 322$_d$. Alternatively, wiring line 620$_a$ may be connected motherboard 106 by way of interconnect 114$_a$. Wiring line 620$_a$ is configured to provide or have a first potential (e.g. a ground potential, low potential, or the like). As such, wiring line 620$_a$ provides the first potential to the pad 612$_a$ of capacitor 610.

Wiring line 620$_b$ may be connected to IC device 302$_b$ by way of interconnect 322 or interconnect 322$_d$ or may be connected to IC device 302$_a$ by way of interconnect 322$_b$ or interconnect 322$_a$. Alternatively, wiring line 620$_b$ may be connected motherboard 106 by way of interconnect 114$_b$. Wiring line 620$_b$ is configured to provide or have a second potential or opposite polarity relative to the first potential (e.g. a non-ground potential, high potential, or the like). Wiring lines 620$_a$, 620$_b$ may provide the first potential and second potential to capacitor 610 such that the capacitor 610 becomes charged, holds a charge, or the like. Capacitor 600 may be utilized by system 600 to block or shunt electrical signals, noise, or the like from transferring or propagating between e.g., IC device 302$_a$, 302$_b$, etc.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 308, regardless of the actual spatial orientation of the carrier 308. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. A method of fabricating an integrated circuit (IC) device carrier package comprising:

aligning a lid-ridge with an IC device carrier, the lid-ridge consisting of a metal bar, a plurality of upper contacts formed upon an upper surface of the metal bar, and a plurality of lower contacts formed upon a lower surface of the metal bar;

connecting a lower contact of the lid-ridge to a pad of an IC device carrier with a first nano particle metallic paste, wherein the lower contact of the lid-ridge is one of the plurality of lower contacts formed upon the lower surface of the metal bar;

sintering the first nano particle metallic paste to form a first metallic connection between the lower contact and the first pad;

subsequent to sintering the first nano particle metallic paste, attaching an IC device to the IC device carrier with solder interconnects;

forming a contiguous underfill material instance between the IC device and the IC device carrier and between the metal bar of the lid-ridge and the IC device carrier;

applying a thermal interface material to the IC device upper surface;

applying a second nano particle metallic paste to the underside of a lid;

attaching the lid to the lid-ridge by connecting an upper contact of the lid-ridge to the underside of the lid with the second nano particle metallic paste, wherein the upper contact of the lid-ridge is one of the plurality of upper contacts formed upon the upper surface of the metal bar; and curing the thermal interface material and sintering the second nano particle metallic paste to form a second metallic connection between the upper contact and the lid.

2. The method of claim 1, further comprising:

applying a seal band material to the IC device carrier around the perimeter of the IC device and the lid-ridge.

3. The method of claim 2, further comprising:

attaching the lid to the IC device carrier with the seal band material.

4. The method of claim 2, further comprising:

attaching the lid to the IC device with the thermal interface material.

5. The method of claim 1, wherein the pad of the IC device carrier provides a ground potential.

6. The method of claim 5, wherein the pad of the IC device carrier grounds the lid-ridge and grounds the lid.

* * * * *